(12) United States Patent
Greenbaum et al.

(10) Patent No.: US 6,556,002 B1
(45) Date of Patent: Apr. 29, 2003

(54) WIDEBAND INSTANTANEOUS POLARIZATION MEASUREMENT

(75) Inventors: Myron H. Greenbaum, South Orange, NJ (US); Eugene R. Schineller, Glen Rock, NJ (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 0 days.

(21) Appl. No.: 09/924,567

(22) Filed: Aug. 8, 2001

(51) Int. Cl.[7] .............................................. G01R 23/12
(52) U.S. Cl. ..................................... 324/76.52; 356/367
(58) Field of Search ........................... 324/76.43, 76.52, 324/76.77, 362; 356/367, 369, 337; 342/188, 357–362, 149; 343/756; 359/192, 303, 618, 156; 380/9, 49

(56) References Cited

U.S. PATENT DOCUMENTS 5,420,590 A * 5/1995 Shea ........................... 342/188
6,175,327 B1 * 1/2001 Lin et al. ................ 342/357.06

* cited by examiner

*Primary Examiner*—N. Le
*Assistant Examiner*—Amy He
(74) *Attorney, Agent, or Firm*—Lerner, David, Littenberg, Krumholz & Mentlik, LLP

(57) ABSTRACT

Apparatus and methods for measuring the polarization of a received signal. The horizontal and vertical signal components of the incoming signal are coupled to a plurality of channels operating in parallel, each channel having predetermined phase shift values and combining the phase-shifted components so as to produce output signals. One or more parameters of the output signals from each channel are supplied to a processor which determines values of the phase shifts which would yield a null condition, and thereby estimates the polarization of the received signal.

24 Claims, 5 Drawing Sheets

WIDEBAND INSTANTANEOUS POLARIZATION MEASUREMENT

BACKGROUND OF THE INVENTION

The present invention relates to apparatus and methods for determining the polarization of electromagnetic signals.

Electromagnetic signals such as radio waves and light have a property referred to as polarization. Radar operates by transmitting an electromagnetic signal to a target and comparing the signal reflected from the target with the transmitted signal. In modern electronic warfare, targets avoid detection from enemy radar by using various countermeasures such as, jamming an enemy radar signal impinging on the target with a signal denying range information to the enemy and creating false reflected signals to deceive the enemy radar system. To be effective, the signals created by the countermeasure system should have characteristics such as polarization corresponding to the signal characteristics expected by the enemy system as, for example, characteristics of the return signals expected by an enemy radar system. In some cases, the enemy radar may change its signal polarization rapidly. Such a radar system is referred to as "polarization agile." If the enemy radar is polarization agile, the countermeasure system must be capable of determining the polarization of the transmitted signal rapidly, so that the countermeasure system can change the signals which it emits. For example, a jamming system carried on an aircraft and intended to defeat a polarization agile enemy radar system should determine the polarization of the incoming radar signal and alter the polarization of the jamming signal accordingly. If the jamming system does not do this, the jamming signal will not match the polarization of the return signals from the aircraft. The enemy radar receiver can reject the jamming signals and acquire meaningful return signals. Delay in measuring the incoming signal polarization can allow the enemy system to acquire meaningful return signals for a sufficient time to find the position of the aircraft. Conversely, where a radar or communications system must overcome enemy jamming, it is desirable to measure the polarization of the jamming signal and transmit the radar or communications signal with a different polarization.

However, traditional polarization measuring techniques do not provide polarization measurements rapidly enough to counteract a polarization agile enemy system. Just as the receiving system becomes accustomed to one polarization, the enemy system changes polarization.

At a given point in space along the path of an electromagnetic wave and at a given instant in time, an electric field points in a particular direction, denoted by a vector, $\vec{E}$. This vector is perpendicular to the direction of travel of the signal or "propagation vector." The polarization of an electromagnetic wave is described by the orientation of the electric field vector and the manner in which this vector varies with time.

The polarization vector can be split into components $E_x$ and $E_y$ along orthogonal x and y axes perpendicular to the direction of travel of the electromagnetic wave. The component along the x axis commonly is referred to as the "horizontal" component, whereas the component along the y axis is referred to as the "vertical" component. Although these terms are used herein, it should be appreciated that these directions may be arbitrary directions unrelated to the normal gravitational frame of reference. At any given point in space, $E_x$ and $E_y$ vary with time. For example, for a sinusoidal wave having frequency $\omega$, $E_x = A\sin(\omega t)$ and $E_y = B\sin((\omega t)+\alpha)$, where t is time, $\alpha$ is a phase difference and A and B are the magnitudes of the $E_x$ and $E_y$ components. When the $E_x$ and $E_y$ components are in phase ($\alpha=0$), the electric field is linearly polarized. In this condition, the electric field vector at a given point always lies on the same plane. When the $E_x$ and $E_y$ components are out of phase ($\alpha \neq 0$), elliptical polarization results. When the $E_x$ and $E_y$ components of an elliptically polarized electromagnetic signal are of equal magnitude (A=B) and are 90° or 270° out of phase, the signal is said to be circularly polarized.

To measure signal polarization, a dual-aperture (polarized) antenna and a device known as a polarimeter are required. The dual-aperture antenna provides one electrical signal $V_h$ representing the $E_x$ or horizontal component of the electric field of a signal impinging on the antenna, and another electrical signal $V_v$ representing the $E_y$ or vertical component of the electric field of the same signal. These signals typically are amplified and filtered separately in a dual-channel receiver before passing to the polarimeter. The polarimeter compares these signals to determine their relative magnitudes and the phase difference between them.

A prior art analog polarimeter is shown in FIG. 1. The horizontal signal $V_h$ is supplied to one input of a four port directional coupler 200 of a type referred to as a "hybrid." The vertical signal $V_v$ is supplied to the input of a phase shifter 202 which applies a known phase shift $\gamma$ to that signal. The phase-shifted signal is supplied to another input of the directional coupler 200. The coupler 200 couples the signals supplied to its input and provides a signal at a first output 204 representing the coupled power output or sum of the input signals supplied to the circuit, and also provides another signal at a second output 206 representing another combination of the input signals with a specific phase shift, 180° in this example, between the input signals. The first or sum output 204 of circuit 200 is supplied to the input of a further phase shifter 208 which applies a known phase shift $\phi$. The output of this phase shifter is connected to one input of another directional coupler 210, which is similar to the first 200. The second or difference output 206 of coupler 200 is connected directly to the other input of coupler 210. Thus, when time-varying $V_v$ and $V_h$ signals are applied to the polarimeter, one time-varying output signal, referred to as the $\Sigma$ signal appears at the difference output 212 of coupler 210. Another time-varying output signal referred to as the $\Delta$ signal, appears at the sum output 214 of coupler 210. The output signals are supplied to a dual-channel receiver and logarithmic amplifier 216 which monitors the amplitudes of these signals and provides a signal representing a ratio between their amplitudes. This ratio signal is supplied to a null adaptive tracker 218, which adjusts the phase differences $\phi$ and $\gamma$ applied by the phase shifters to achieve a null condition as discussed below.

The relationships between the $\Sigma$ and $\Delta$ output signals appearing at the outputs 212 and 214 of the second 180° coupler 210 and the input signals $V_v$ and $V_h$ are referred to as the "transfer functions" of the polarimeter. These transfer functions depend on the phase shift values $\gamma$ and $\phi$ applied by the phase shifters 202 and 208. Conversely, there is a relationship between the transfer functions which yield output signals with particular characteristics and the phases and amplitudes of $V_v$ and $V_h$. Stated another way, there is a relationship between the phase shifts $\phi$ and $\gamma$ which yield particular output signal characteristics and the phases and amplitudes of the input signals $V_v$ and $V_h$.

In particular, for the components illustrated in FIG. 1, the ratio $$\frac{|\Delta|}{|\Sigma|}$$

between the amplitude $|\Delta|$ of the $\Delta$ output signal and the amplitude $|\Sigma|$ of the $\Sigma$ output signal will be at a minimum or null condition when:

$$\gamma = 2\tan^{-1}\left(\frac{b}{a}\right), \text{ and} \quad (1)$$

$$\phi = \frac{3\pi}{2} - \alpha. \quad (2)$$

Where:

a is the amplitude of the horizontal component $V_h$; b is the amplitude of the vertical component $V_v$; and $\alpha$ is the phase difference between these components.

Solving for the amplitude ratio $$\frac{b}{a}$$

and phase difference $\alpha$ from the $\gamma$ and $\phi$ values, $$\frac{b}{a} = \tan\left(\frac{\gamma}{2}\right), \text{ and} \quad (3)$$

$$\alpha = \frac{3\pi}{2} - \phi. \quad (4)$$

Thus, the parameters that characterize the polarization of the input signal, such as the amplitude ratio $$\frac{b}{a}$$

and the phase difference $\alpha$ between the components of the signal can be found from the phase shifter values $\phi$ and $\gamma$ that yield the null condition or minimum ratio $$\frac{|\Delta|}{|\Sigma|}.$$

Tilt angle, $\tau$, of an elliptically polarized signal is also derivable from the polarimeter phase shifter values $\phi$ and $\gamma$ at the null condition as $$\tau = \frac{1}{2}\tan^{-1}\left[\tan(2\gamma)\cos\left(\phi - \frac{3\pi}{2}\right)\right]. \quad (5)$$

In operation, tracker 218 sets the $\gamma$ phase shifter 202 to hold $\gamma$ constant at an arbitrary value and adjusts the $\phi$ phase shifter 208 to vary $\phi$ in an iterative or trial-and-error process until the output ratio $$\frac{|\Delta|}{|\Sigma|}$$

is at a minimum for the arbitrary value of $\gamma$. The tracker 218 then holds $\phi$ constant and adjusts phase shifter 202 to vary $\gamma$ in a further iterative process until the true minimum or null condition is found.

Other analog polarimeters use different networks, typically including phase shifters and couplers. However, the overall principle of operation is the same. The transfer function or functions of the polarimeter is adjusted iteratively to yield output signals having predetermined characteristics, and the polarization of the signal is found from the transfer function or functions which yield those characteristics. Polarimeters of this type can provide accurate measurements of signal polarization. However, they require considerable time to perform the required iterations.

SUMMARY OF THE INVENTION

One aspect of the invention provides apparatus for measuring the polarization of a received signal that has two orthogonal components. Apparatus according to this aspect of the invention preferably includes first and second system input terminals where the components of the received signal are applied, and a plurality of channels, each such channel being simultaneously connected to the input terminals so that each channel will be supplied with both of the components. Each channel includes means for combining the received signal components according to a combining scheme having one or more characteristic variables so as to produce a set of one or more output signals. Most preferably, the combining means of each channel includes one or more phase shifters, and the characteristic variables include values of the phase shifts applied by the phase shifters of the various channels. In one embodiment, the combining means of each channel includes a combining circuit including two phase shifters and two couplers similar to those used in the iterative polarimeter discussed above, except that the phase shifters of each channel operate at preset phase shift values which do not change. Each such combining circuit produces a $\Delta$ output signal and a $\Sigma$ output signal.

Different ones of the combining means apply combining schemes with different values of the characteristic variables, as, for example, different phase shifts. Thus, different values of the characteristic variables are associated with the different channels and with the different sets of output signals produced by these channels. The apparatus further includes means for measuring at least one parameter of each said set of output signals as, for example, one or more detectors for measuring the ratio of amplitudes of the output signals or a function of such ratio. The apparatus further includes means for estimating the polarization of the received signal based on said measured parameters of a plurality of the sets of output signals and the values of the characteristic variables of the combining schemes associated with such sets of output signals.

In one arrangement, the estimate of polarization is made by selecting a particular set of parameters which best meets a preset criterion. In the example where the set of parameters measured for the set of output signals for each channel consists of the amplitude ratio, the means for estimating the polarization may include analog or digital components which select the lowest amplitude ratio and thus identify the channel which provided the set of output signals having the lowest amplitude ratio. In this example, different preset values of the phase shifts are associated with each channel, and selection of a particular channel implicitly selects values of the phase shifts which are closest to the values which would produce the null condition.

In another arrangement, the means for estimating polarization includes means for deriving a theoretical set of characteristic variable values which would yield a set of output signals meeting one or more predetermined criteria if applied to the components of the received signal, this derivation being based on the measured parameters of the output signals from the various channels and the values of the characteristic variables associated with the measured parameters. In the example discussed above, for a given incoming signal the amplitude ratio is a dependent variable of two independent variables, namely, the values of the phase shifts. The measured values of the amplitude ratio constitute sample values taken at known values of the independent variables. The means for deriving may include a programmed processor performing a mathematical minimization algorithm. This approach provides particularly accurate estimates of polarization with a limited number of channels.

Another aspect of the invention provides methods of determining the polarization of a received signal that has two orthogonal components. Methods according to this aspect of the invention desirably include combining the components with one another according to a plurality of different combining schemes, each having different values of characteristic variables to produce a plurality of output signals. A set of one or more of said output signals is created by each of the combining schemes. Two or more of different combining schemes are applied simultaneously to produce two or more sets of output signals simultaneously, as, for example, by routing the components of the received signals through plural parallel channels as discussed above in connection with the apparatus. The method further includes measuring one or more parameters of each said set of output signals, and providing an estimate of the incoming signal polarization based on the measured parameters of the various sets of output signals. This step may be performed, for example, by selecting one said set of output signals which best meets one or more predetermined criteria and thereby selecting the combining scheme associated with that set. Alternatively or additionally, this step can be performed by deriving a set of characteristic variables as discussed above in connection with the apparatus.

Apparatus and methods according to certain preferred embodiments of the invention can provide extremely rapid estimates of the signal polarization. Certain preferred embodiments of the invention can be applied to measurement of polarization of microwave signals as, for example, signals in the range of 4–18 GHz.

Other objects and advantages of the apparatus and methods will become apparent to those skilled in the art after reading the detailed description of the preferred embodiment.

DETAILED DESCRIPTION OF THE PREFERRED EMBODIMENTS

Figure 1:
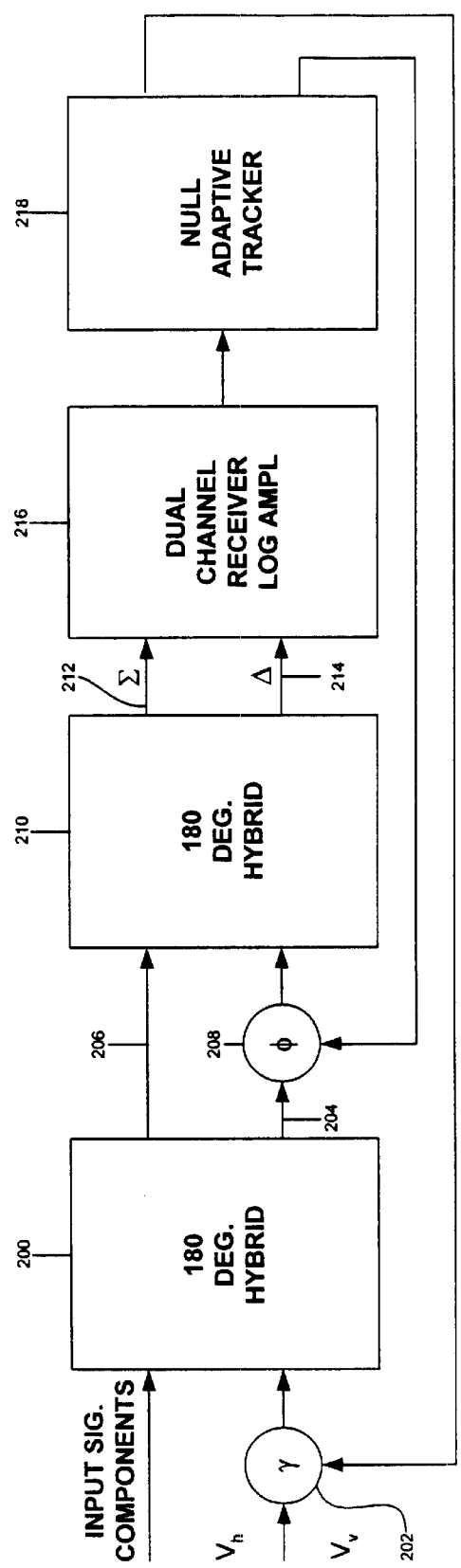
FIG. 1 is a system block diagram of a prior art polarimeter.

The embodiments will be described with reference to the drawing figures where like numbers represent like elements throughout.

Figure 2:
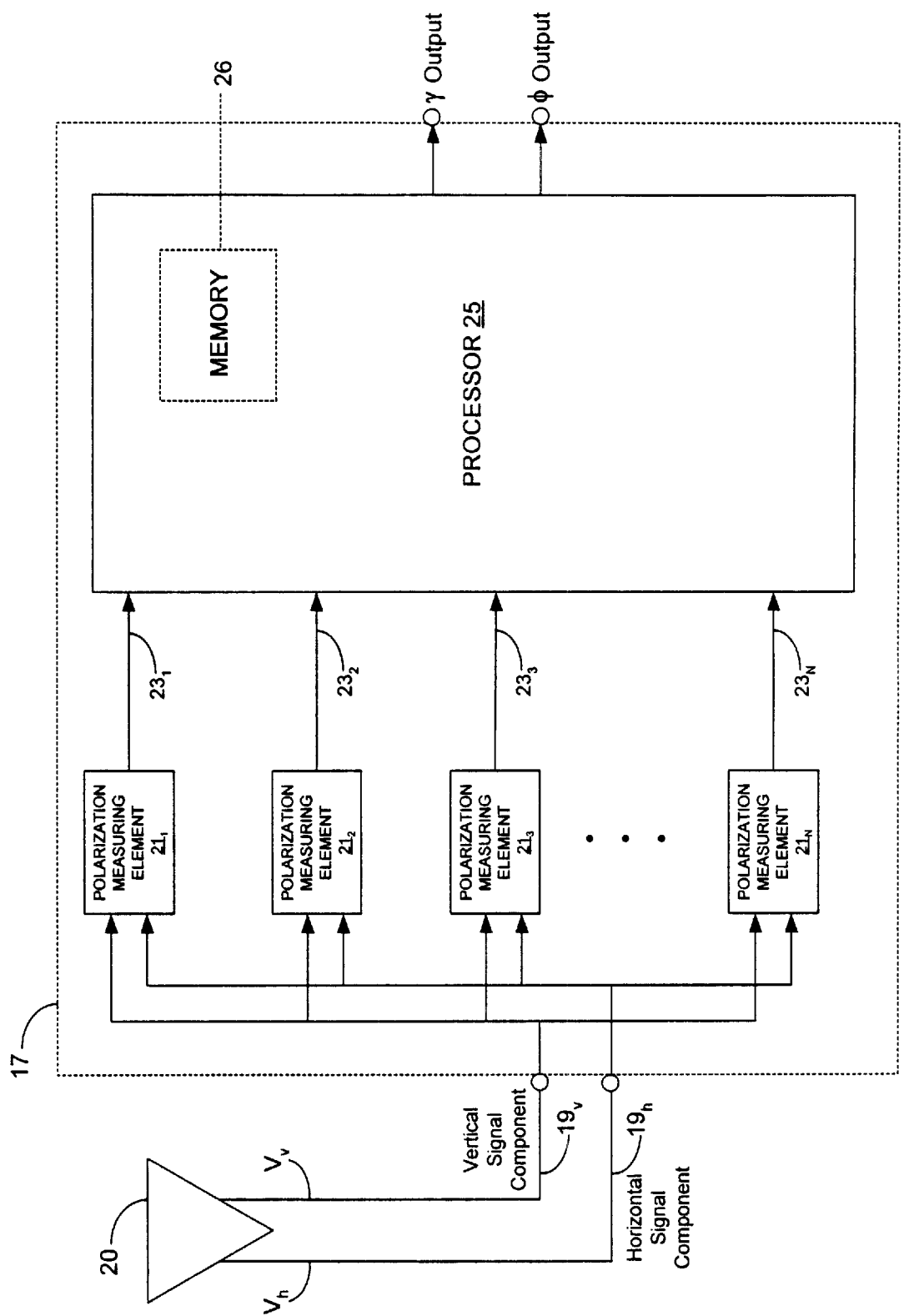
FIG. 2 is a block diagram of apparatus according to one embodiment of the present invention.

FIG. 2 shows an overall block diagram of the apparatus 17 according to one embodiment of the present invention. The apparatus 17 comprises a horizontal component system input $19_h$ and a vertical component system input $19_v$ for accepting horizontal and vertical signal components $V_h$ and $V_v$, respectively. The signal components may be obtained from a main antenna and receiver 20 or other receiving source. The apparatus further includes a plurality of channels $21_1, 21_2, 21_3, \ldots 21_N$, (where the subscript indicates a discrete channel n) and a processor 25. As further discussed below, the number of channels N is selected to achieve a desired accuracy in the polarization estimate produced by the apparatus; more channels will provide a more accurate estimate, but at higher cost. Most typically, 32 to 1056 channels are employed in a single apparatus, although more or fewer channels can be used. One exemplary system discussed below includes 64 channels.

Figure 3:
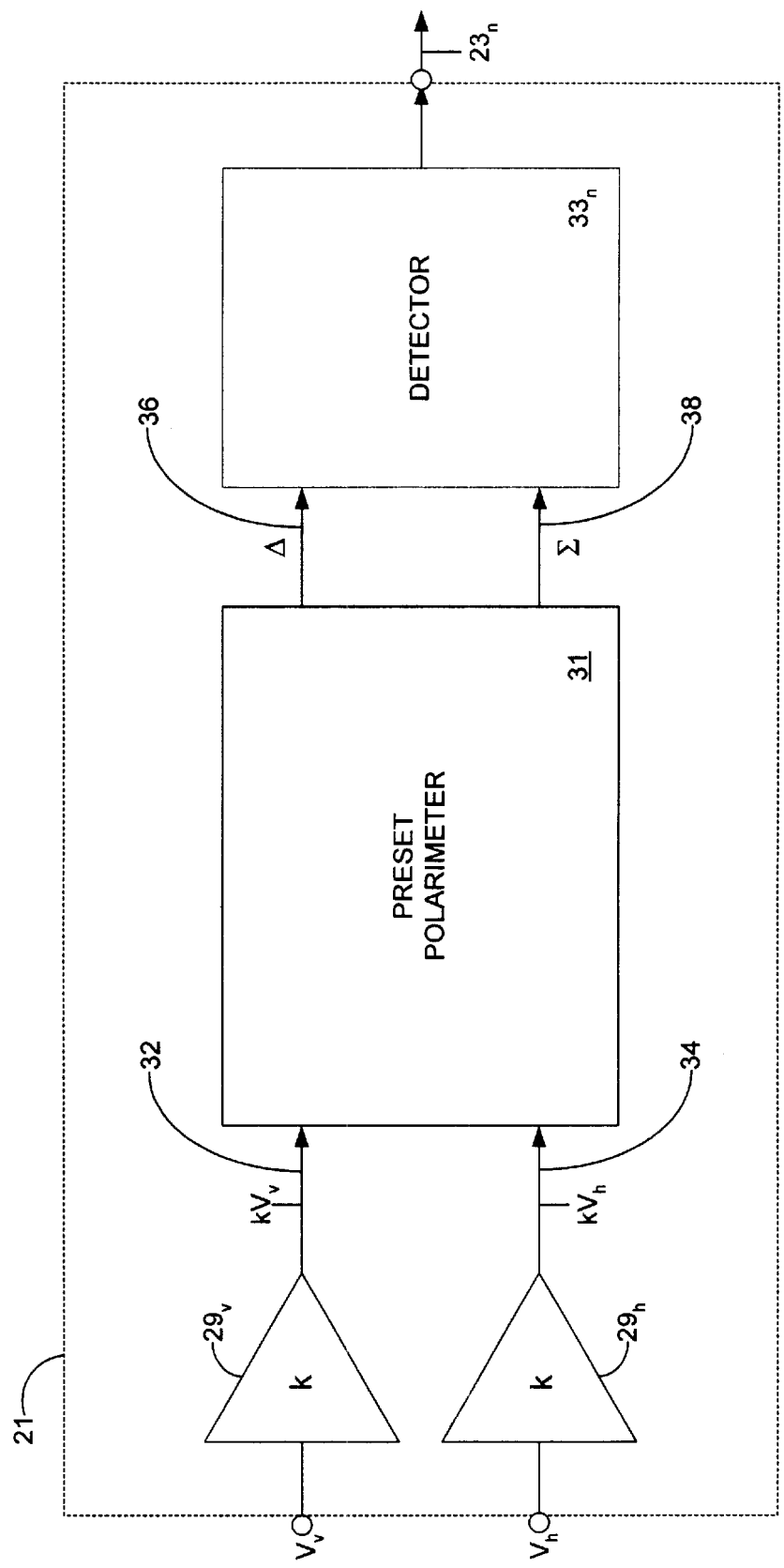
FIG. 3 is a block diagram of a channel incorporated in the apparatus of FIG. 2.
Figure 4:
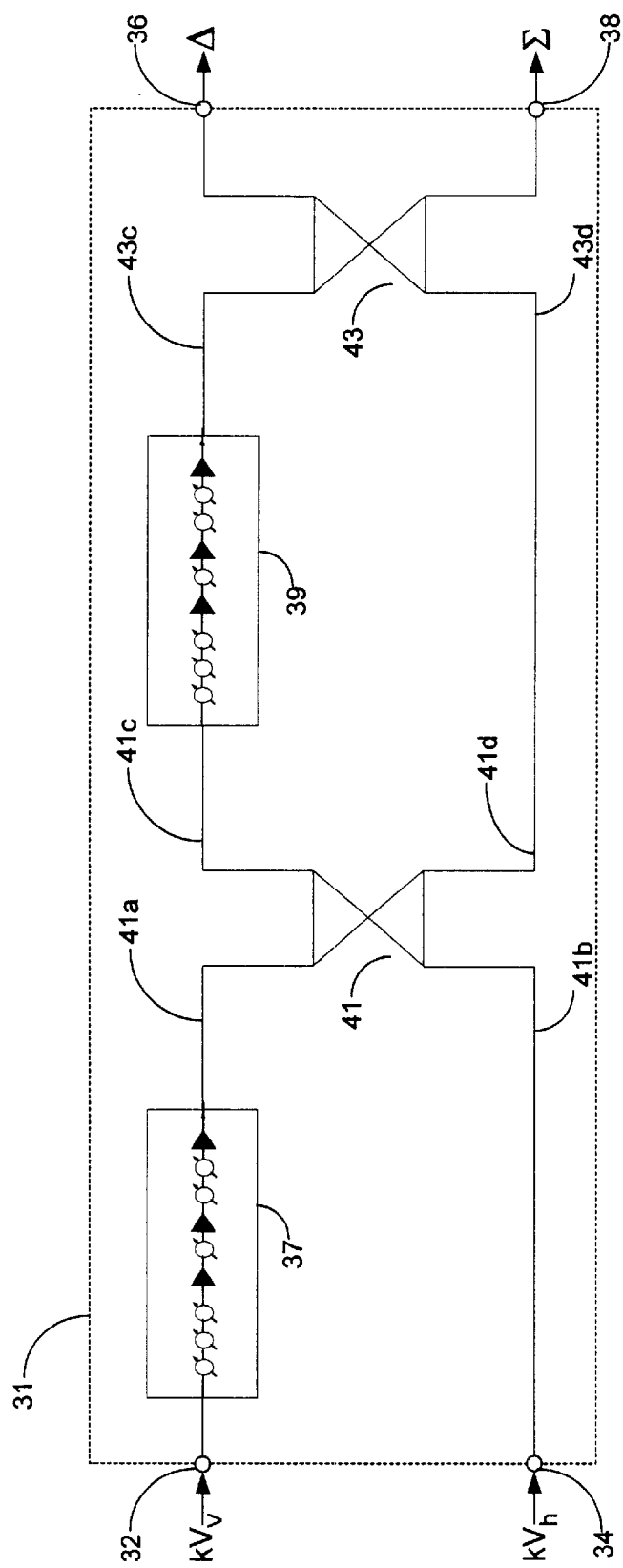
FIG. 4 is a block diagram of one embodiment of a circuit incorporated in the channel of FIG. 3.

Each channel 21 includes a combining circuit 31 (FIG. 3) having a first input connection 32, a second input connection 34, a first or Δ output 36 and a second or Σ output 38. As best seen in FIG. 4, each combining circuit 31 includes a first phase shifter 37 having an input connected to the first input connection 32 of the combining circuit 31. First phase shifter 37 is a conventional multi-bit phase shifter; the phase shift γ applied by phase shifter 37 can be set to any of several discrete values. Each combining circuit 31 also includes a first coupler 41 having one input 41a connected to the output of the first phase shifter 37 and another input 41b connected to the second input connection 32 of the combining circuit. The first coupler has a first intermediate signal output 41c and a second intermediate signal output 41d. First coupler 41 is a conventional device of the type referred to as a four-port directional coupler. It is arranged to couple a portion of the signal appearing at input 41a to output 41c and also couples a portion of the signal at input 41a to output 41d, such portion being shifted by a fixed phase shift of 180°. Coupler 41 also couples a portion of the signal at input 41b to output 41d, and couples a portion of the signal at input 41b to output 41c, this portion also being phase-shifted by 180°. Accordingly, the signal appearing at output 41c represents one combination of the signals appearing at inputs 41a and 41b, whereas the signal appearing at output 41d represents a different combination of the signals at inputs 41a and 41b.

Each combining circuit 31 also includes a second phase shifter 39 having its input connected to the first intermediate signal output 41c of the first coupler 41. The second phase shifter 39 is similar to the first phase shifter 37. Each combining circuit 31 further includes a second coupler 43, similar to the first coupler 41. Second coupler 43 has a first input 43c connected to the output of second phase shifter 39 and a second input 43d connected to the second output 41d of first coupler 41. The second coupler 43 has a first output which constitutes the first or Δ output 36 of the combining circuit 31, and a second output which constitutes the second or Σ output 38 of the combining circuit. In systems intended to operate on signals at microwave frequencies, each combining circuit desirably is provided as a monolithic microwave integrated circuit (MMIC), which is an analog/digital hybrid circuit, or as a portion of such an MMIC.

Each channel 21 further includes a detector 33 having a first input connected to the first or Δ output 36 of the combining circuit 31 in the same channel, and has a second input connected to the second or Σ output 38 of the same combining circuit 31, and a parameter output 23. Each detector includes conventional components for determining a function of the magnitude ratio $$\frac{|\Delta|}{|\Sigma|},$$

where $|\Delta|$ is the amplitude of the signal appearing at output 36 and $|\Sigma|$ is the magnitude of the signal appearing at output 38, and providing a parameter signal representing the value of that function. Merely by way of example, where the function of the magnitude ratio is a logarithm of the magnitude ratio, each detector 33 may include a dual-channel receiver and logarithmic amplifier.

Each channel further includes a first input amplifier $29_v$ (FIG. 3) associated with the first input connection 32 of the combining circuit 31 and a second input amplifier $29_h$ associated with the second input connection 34 of the combining circuit 31. The first input amplifiers $29v$ of all of channels 21 ($21_1$ through $21_N$) are connected to the vertical component system input connection $19_v$ (FIG. 2). Thus, the first input connection 32 of the combining circuit in each channel is connected, through the associated input amplifier $29v$, to system input connection $19v$. Likewise, the second input amplifiers $29_h$, and hence the second input connections 34 of all of the combining circuits in all of channels 21, are connected to the horizontal component system input $19h$. Amplifiers $29_v$ and $29_h$, compensate for input signal attenuation due to splitting the input signal among the plurality of channels $21_1$, $21_2$, $21_3$, . . . $21_N$. Each amplifier $29_h$, $29_v$ typically has a gain of about 30dB. The amplifiers associated with each channel should be closely matched in amplitude gain and in phase delay over the operating frequency range of the system. If the input signals at system input connections $19h$ and $19v$ are of sufficient strength, the amplifiers can be omitted.

The outputs 23 of the detectors associated with the various channels are connected to a processor 25. The processor 25 can function in either the digital or analog domains and can therefore be embodied as a comparator, a series of comparators, a fixed gate array (FGA), a field programmable gate array (FPGA), an application specific integrated circuit (ASIC), a digital signal processor (DSP), or a programmed general purpose microprocessor to achieve the functions described herein. The processor receives the parameter signals from the detector outputs 23 from all of the various channels and determines which channel provided the signal representing the lowest value. Merely by way of example, the processor 25 may include a memory 26, which may be in the form of a conventional RAM or other memory. The parameter values denoted by all of the parameter signals can be written into the memory along with a channel identification for each value as, for example, by writing all such values simultaneously so that each value is stored in a memory location preassigned to such channel. The processor then calls up the values and identifications, selects the lowest value and writes the channel identification associated with the lowest value into a lowest-value register in the memory. In another arrangement where the parameter signals are provided at outputs 23 as analog voltages, the processor may include a conventional sampling circuit arranged to sample the various output $23_1$ through $23_N$ sequentially and to provide a digital representation of the value of the signal being sampled; a value register for storing a lowest value of the parameter signal; a channel identity register for storing the identity of the channel associated with such lowest value, as well as a comparator for comparing the value currently being sampled with the value stored in the lowest-value register. As the sampling circuit samples the value of the parameter signal from the $n^{th}$ channel, the comparator tests that value against the stored value in the value register. If the value from the nth channel is lower than the stored value, the processor writes the value from the $n^{th}$ channel into the value register and writes the channel identity n into the channel identity register, so that previously-stored values in both registers are replaced. If not, the previously-stored value remains. This cycle is repeated for every channel in sequence, so that at the end of the sequence the channel register contains the identity of the channel which provided the parameter signal with the lowest value. Many other algorithms and structures for performing the overall function of identifying the channel associated with the lowest-valued signal are known to those in the art, and any of these can be implemented by the processor.

In operation, in a method according to one embodiment of the invention, the first phase shifters 37 of the combining circuits 31 in the various channels are preset to various values of γ, and the second phase shifters 39 of the combining circuits in the various channels are preset to various values of phase shift ϕ. Thus, different channels are preset to apply different combinations of phase shifts γ and ϕ to the signals passing through them. The preset values may be permanently set when the system is built, or may be set prior to operation by control signals sent to the phase shifters. In either case, however, the values used in each channel do not change during a signal processing cycle as discussed below. The number N of channels $21_1$, $21_2$, $21_3$, . . . $21_N$ and their respective γ and ϕ phase shift values are known, a priori, to the processor 25. For example, the phase shift values associated with each channel may be stored in memory 26 of the processor.

Signal source 20 provides the horizontal $V_h$ signal component to system input connection $19_h$ and thus provides this component to the second input 34 of the combining circuit 31 (FIG. 3) in each channel 21. Likewise, the vertical signal component is provided through system input connection $19v$ to the first input 32 of the combining circuit in each channel.

The combining circuit 31 of each channel 21 combines the incoming vertical and horizontal components with one another while applying a particular value of the first or γ phase shift and a particular value of the second or ϕ phase shift to the signals passing through it, to produce a set of output signals for such channel consisting of a Δ output signal at the first output connection 36 of the combining circuit and a Σ output at the second output connection 38 of the combining circuit. Stated another way, each combining circuit 31 combines the components of the received signal with one another according to a combining scheme in which the phase shifts γ and ϕ are characteristic variables which influence the output signals, and different values of these characteristic variables are used by the combining circuits of different channels. Each combining circuit performs a polarimetric transfer function operation as discussed above with reference to the prior art polarimeter of FIG. 1 except that the trial-and-error iterative process is not executed. Instead, the set of ϕ and γ phase shift values are predetermined and fixed, one unique set for each channel. All of the combining circuits operate simultaneously.

The set of output signals Δ and γ from the combining circuit of each channel passes to the detector 33 of that channel, and the detector derives the a function of the magnitude ratio $$\frac{|\Delta|}{|\Sigma|}$$

for that set of output signals, and provides that parameter in a parameter signal at the output 23 of the detector. Thus, the detector associated with each channel derives a parameter of the set of output signals provided by that channel. That parameter represents the results achieved using a combining scheme with the particular values of the characteristic variables applied by the combining circuit of the particular channel. The processor 25 selects the parameter output signal having a value of the function which represents the lowest value of the magnitude ratio $$\frac{|\Delta|}{|\Sigma|},$$

and identifies the channel associated with that signal. Because each channel is associated with a set of preset values for the characteristic variables φ and γ, identification of a particular channel also implicitly identifies the set of values for the characteristic variables associated with the channel. The selected channel is the channel which produces the smallest magnitude ratio. As explained above in connection with the iterative polarimeter of FIG. 1, the ratio $$\frac{|\Delta|}{|\Sigma|}$$

between the amplitude |Δ| of the Δ output signal and the amplitude |Σ| of the Σ output signal will be at a minimum or null condition when:

$$\gamma = 2\tan^{-1}\left(\frac{b}{a}\right), \text{ and} \quad (1)$$

$$\phi = \frac{3\pi}{2} - \alpha. \quad (2)$$

Where a is the amplitude of the horizontal component $V_h$; b is the amplitude of the vertical component $V_v$; and α is the phase difference between these components.

By selecting the channel which is associated with the smallest amplitude ratio, the processor selects the channel associated with the values of the phase shifts or characteristic variables γ and φ closest to the values which would produce the null condition. Thus, selection of a particular channel by the processor implicitly selects one set of values of γ and φ as an estimate of the values which would produce the null condition. The values of the characteristic variables γ and φ at the null condition can be translated directly to the values of the phase angle α and amplitude ratio $$\frac{b}{a}$$

of the incoming signal. Thus, selection of a particular channel implicitly selects an estimate of the polarization of the incoming signal. This estimate can be output by processor 25 in any form. Where the processor memory stores values of γ and φ associated with each channel, the processor may output these values for the selected channel, or may convert these values to values of α and $$\frac{b}{a}.$$

Preferably, the memory stores values of α and $$\frac{b}{a}$$

associated with each channel, corresponding to the estimated polarization associated with that channel, and the stored values of α and $$\frac{b}{a}$$

for the selected channel are output. In another alternative, the output from the processor may include the identity of the selected channel, with or without other information.

Because the numerous channels operate in parallel, the system provides the estimated polarization rapidly, without the delay inherent in the iterative process. Moreover, the system can track a rapidly-changing polarization. As the polarization of the incoming signal changes, the output signals from the combining circuits of the various channels, and the corresponding parameter signals, will change with the incoming signal. The processor can provide a new, updated estimate of the polarization.

The accuracy of the system is determined initially by the granularity, or number N of channels $21_1, 21_2, 21_3, \ldots 21_N$ employed. For example, one embodiment of the invention uses MMIC polarimeters or combining circuits 31 incorporating two, three-bit phase shifters (one for the γ phase shifter 37 and one for the φ phase shifter 39); eight binary states or values are available for each phase shifter setting. Since a polarization measurement must be performed over a phase difference of 180°, the eight phase shift stepped values for each phase shifter are equally distributed over the range of 180° at increments of:

$$\frac{180°}{8} = 22.5°. \quad (6)$$

This embodiment of the present invention uses a total of 64 channels $21_1, 21_2, 21_3, \ldots 21_{64}$ covering the following predetermined γ and φ phase shift value combinations in degrees:

TABLE 1

| φ | γ |
|---|---|
| 0.0 | 0.0 22.5 45.0 90.0 112.5 135.0 157.5 180.0 |
| 22.5 | 0.0 22.5 45.0 90.0 112.5 135.0 157.5 180.0 |
| 45.0 | 0.0 22.5 45.0 90.0 112.5 135.0 157.5 180.0 |
| 90.0 | 0.0 22.5 45.0 90.0 112.5 135.0 157.5 180.0 |
| 112.5 | 0.0 22.5 45.0 90.0 112.5 135.0 157.5 180.0 |
| 135.0 | 0.0 22.5 45.0 90.0 112.5 135.0 157.5 180.0 |
| 157.5 | 0.0 22.5 45.0 90.0 112.5 135.0 157.5 180.0 |
| 180.0 | 0.0 22.5 45.0 90.0 112.5 135.0 157.5 180.0 |

The quality of a polarization measurement is referred to as the null depth and is expressed in decibels (dB). The relationship between phase resolution and null depth is $$\text{null (in dB)} = 20\log\left[(\delta\psi)\left(\frac{radians}{57.3°}\right)\right], \quad (7)$$

where δψ is phase resolution in degrees. Because the system discussed above uses only a finite number of channels, and selects from a corresponding number of polarization estimates, its phase resolution is limited. The phase resolution of a the system as discussed above is plus or minus one-half of the increment between phase shift settings, or ±11.25° for the system using 64 channels with three-bit phase shifters to provide 22.5° phase shift increments. A ±11.25° accuracy in phase measurement yields a maximum polarization null depth of only −14 dB (Equation (7)).

A system using a greater number of channels, with phase shifters having phase shifter value resolutions greater than three bits and finer increments in the phase shifts, will provide better resolution. For each additional bit, a doubling of the measurement resolution is achieve at the expense of quadrupling the number of channels N. The accuracy in an embodiment of the system employing 256 channels with 4-bit phase shifters would be ±5.625° (or a null depth of −20dB).

In a variant of this approach, the system can operate cyclically. In a first stage of the cycle, the phase shifters of the various channels are set to a first group of values spanning the entire range of possible values (180°) for each phase shift and with relatively large increments between phase shift values, so as to provide a first, relatively crude estimate of polarization. Once this first-stage estimate has been found, the phase shifters are reset to new values corresponding to polarizations in the neighborhood of the first-stage estimate. The phase shift values in the second stage do not span the entire range of possible values, and hence can be at small increments. The polarization estimate in the second stage thus has a much finer resolution. The same approach can be applied with three or more stages, with progressively finer resolution in each succeeding stage. This approach involves some delay in arriving at the best estimate of polarization, but provides a better tradeoff between number of channels and accuracy. It still provides the best estimate in a shorter time than would be required for a single-channel, iterative approach as discussed above with reference to FIG. 1. Moreover, the initial estimate of polarization is provided as soon as the first stage is complete.

In a further variant, the system can use closely-spaced phase shift values which do not cover the full range (such as those used in the second or later stage of the multi-stage approach) to track a signal with progressively changing polarization. The center point of the array of values can be continually updated based on the last estimate of polarization, so that the array of values used on each cycle provide for polarizations in the neighborhood of the last-estimated polarization.

Figure 5:
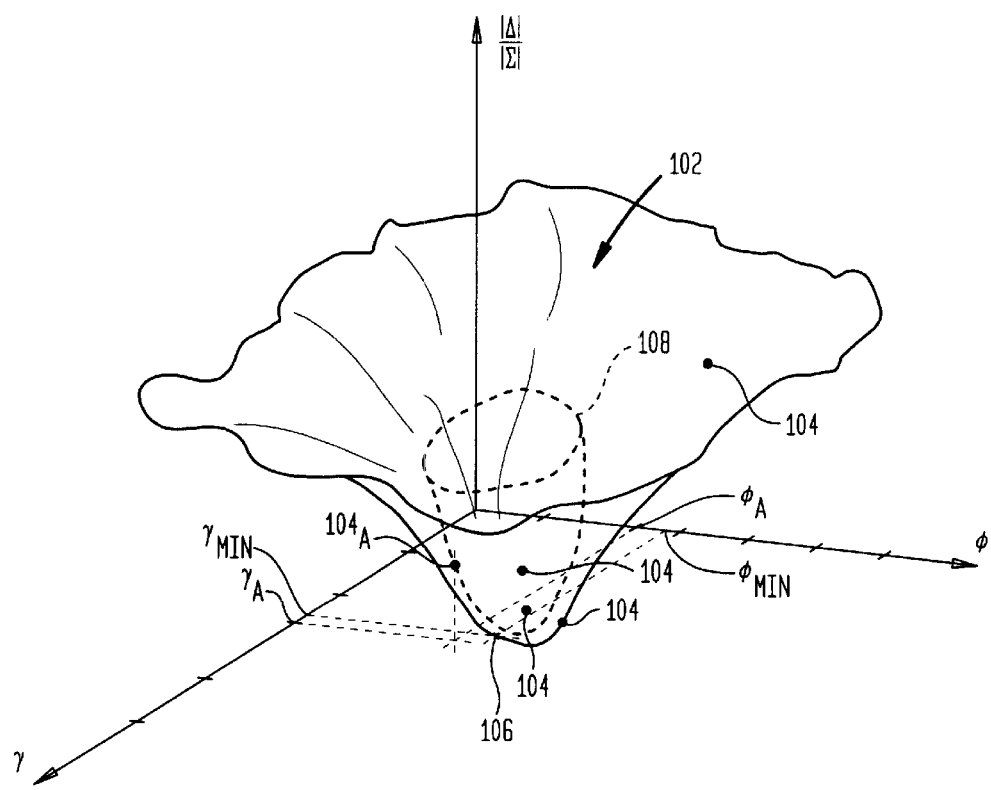
FIG. 5 is a graph illustrating a function used in a further embodiment of the invention.

According to a further embodiment of the invention, the processor 25 derives a set of characteristic variables (phase shifts γ and φ) which would provide the null based on the actual values of the characteristic variables used by the actual channels and the measured parameters of the output signal sets. For any given incoming signal, the parameter value or magnitude ratio $$\frac{|\Delta|}{|\Sigma|}$$

measured for a set of output signals from a particular combining circuit is a function of the characteristic variables γ and φ applied by that combining circuit. This is illustrated in graphical form in FIG. 5, in which the parameter value is plotted against the characteristic variables. Surface 102 represents the parameter values achievable with all possible values of the characteristic variables. This plot is diagrammatic, for illustrative purposes only; it is not drawn to scale or to an accurate shape. The parameter values received by the processor represent samples of the parameter values at discrete values of the characteristic variables, shown as points 104 on surface 102. Each parameter value or sample 104 defines a value of the dependent variable $$\left(\text{the magnitude ratio } \frac{|\Delta|}{|\Sigma|}\right)$$

associated with values of the independent variables (characteristic variables γ and φ). For example, sample value 104a provides a value of the dependent variable (the measured parameter value for a particular set of output signals) associated with independent variable values $\gamma_A$ and $\phi_A$ (the values of γ and φ used in the combining circuit which produced that output signal). The task of finding the derived set of characteristic variables is the mathematical task of minimization of a function of two independent variables, i.e., finding values for the independent variables which yield the minimum value of the dependent variable from samples taken at known values of the independent variables. In terms of the graphical representation of FIG. 5, the processor seeks the values $\gamma_{MIN}$ and $\phi_{MIN}$ which would yield the minimum value of the dependent variable, at minimum point 106 on surface 102. Numerous minimization algorithms are well-known in the art, and any of these can be applied by the processor 25 in this embodiment. Merely by way of example, a surface defined mathematically by a function of known form may be fit to the sample values, or to a subset of the sample values in the neighborhood of the lowest values. For example, a paraboloid 108 or other theoretical surface having a shape defined by equations may be selected using a least-squares fit or other curve-fitting technique, and the minimum point 106 may be estimated as the minimum point of the theoretical surface, which can be found by calculation from the equations defining the theoretical surface. Other minimum finding algorithms are disclosed in the text Numerical Recipes, *The Art of Scientific Computing*, by Press et al., Cambridge University Press, 1986, and particularly in chapter 10 of that text concerning minimization or maximization of functions. The disclosure of said chapter is hereby incorporated by reference herein. These techniques include the techniques commonly referred to as "line minimizations"; "gradient" methods; "steepest descent" methods; and "conjugate gradient" methods.

The process of deriving a set of characteristic variables need not involve strict minimization in the sense of finding the best possible estimate using a particular algorithm. The deriving process can be terminated when it yields a derived set of characteristic variables along with a determination that those characteristic variables, if applied to the incoming signal, would yield a set of output signals having a parameter value closer than a predetermined threshold to zero.

The derived set of characteristic variables (γ and φ in the embodiments discussed above) provide an estimate of the polarization of the incoming signal. Here again, the estimate can be output by the processor 25 as-is, or translated into phase angle and amplitude ratios. The estimated polarization using this process will have better accuracy than that otherwise in a single-cycle process with the same number of channels.

Numerous variations and combinations of the features described above can be used. For example, the combining circuits 31 may be analog circuits performing the aforementioned transfer functions or digital circuits. The functions performed by each individual combining circuit can be performed by a general-purpose or special-purpose processor having integral analog-to-digital (A/D) and digital-to-analog (D/A) conversions may also be used where the processor executes a series of instructions implementing the transfer functions. Discrete digital circuitry, or other like functional circuits may be used. Also, although certain elements have been illustrated as separate functional blocks in FIGS. 1–4, the various elements can be integrated with one another or separated from one another. For example, the detectors 33 of the various channels may be replaced by corresponding elements integrated with processor 25. In one such variation, a single detector integrated with the processor is connected to the output terminals 36 and 38 of the various combining circuits one after the other, so that the detector samples the output signals from the various channels at different times. This is less preferred because it is slower. Thus, the parameter measured by the detector at a particular time is associated with a particular channel and with the combining scheme used by that channel, including its values of the characteristic variables.

Also, the combining circuits and the characteristic variables can differ from those discussed above. In a rudimentary variant, the combining circuit of each channel includes one phase shifter, one amplifier having a settable gain, and a difference circuit having first and second inputs and a single output which constitutes the output connection of the combining circuit. The difference circuit is arranged to provide an output signal which is equal to the difference between the signals supplied to it. One signal component input of the circuit is connected to the input of the amplifier, and the output of the amplifier input of the phase shifter. The output of the phase shifter is connected to the first input of the difference circuit. The other signal component input of the combining circuit is connected to the second input of the difference circuit. When the gain of the amplifier is the inverse of the amplitude ratio in the incoming signal, and the phase shift is the opposite to the phase difference between components of the incoming signal, the output of the difference circuit, and hence the single output signal from the combining circuit, will have zero amplitude. In such a system, the combining circuits of the various channels are set to different values of amplifier gain and phase shift. Each combining circuit produces only a single output signal, and the detector measures only one parameter-the amplitude of this signal. The processor selects the channel which provides the lowest value of this parameter. In a system of this type, the characteristic variables are the gain and phase shift.

The incoming signal supplied to the polarization measurement system most typically is a signal received by a dual-channel antenna as discussed above, but this is not essential. The system can be used, for example, to measure the phase difference and/or amplitude ratio of two components taken from sources completely independent of one another. That is, the two components of the signal need not be horizontal and vertical components of a single signal. For example, the two components can be replicas of a signal received at geographically separated antennas, both of which receive the vertical components of the signal.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method for determining the polarization of a received signal that has two orthogonal components comprising:

(a) combining said orthogonal components with one another according to a plurality of different combining schemes each having different values of characteristic variables to produce a plurality of output signal sets, each one of said output signal sets including one or more output signal sets produced according to one of said plurality of different combining schemes, two or more of said different combining schemes being applied substantially simultaneously to produce two or more of said sets of output signals substantially simultaneously;

(b) measuring one or more parameters of each said set of output signals; and (c) comparing said measured parameters so as to select one said set of output signals which best meets one or more predetermined criteria and thereby select the combining scheme associated with the selected set of output signals, whereby selection of said combining scheme implicitly selects an estimate of the polarization of the received signal.

2. The method of claim 1, wherein all of said combining schemes are applied substantially simultaneously to as to provide all of said sets of output signals substantially simultaneously.

3. The method of claim 1 wherein said step of combining said components with one another is performed by providing said components as inputs to a plurality of combining circuits, each said combining circuit including one or more phase shifters, the shifters of different ones of said combining circuits being operative to apply different sets of phase shifts, the characteristics of said different combining schemes including the phase shifts applied by the phase shifters of said different combining circuits.

4. The method of claim 3 wherein each said combining circuit provides a set of two output signals, and wherein said step of measuring one or more parameters of each said set of output signals includes comparing the amplitude of the one output signal in each such set with the amplitude of the other output signal in such set to thereby derive a polarization parameter signal associated for such set.

5. The method of claim 3 wherein each said combining circuit operates on said components as analog signals.

6. The method of claim 4 wherein each said combining circuit includes a first phase shifter applying a preset phase shift $\phi$ to one said component of the input signal to produce a phase-shifted component, a first coupler combining the phase shifted component with the other component of the input signal to produce first and second intermediate signals, a second phase shifter applying a preset phase shift $\gamma$ to the first intermediate signal to produce a phase-shifted first intermediate signal, and a second coupler combining the phase-shifted first intermediate signal with the second intermediate signal to produce a $\Delta$ output signal having amplitude $|\Delta|$ and a $\Sigma$ output signal having amplitude $|\Sigma|$, and wherein said step of comparing the amplitude of one output signal in each such set with the amplitude of the other output signal in such set includes computing a function of $$\frac{|\Delta|}{|\Sigma|},$$

said step of selecting one set of output signals including the step of selecting the set of output signals which yields the lowest value of $$\frac{|\Delta|}{|\Sigma|}.$$

7. The method of claim 6 further comprising outputting a set of polarization values for the received signal corresponding to the $\gamma$ and $\phi$ values used to produce the selected set of output signals.

8. A method for determining the polarization of a received signal that has two orthogonal components comprising:
(a) combining said orthogonal components with one another according to a plurality of different combining schemes each having different values of characteristic variables to produce a plurality of output signal sets, each one of said output signal sets including one or more output signals produced according to one of said plurality of different combining schemes;
(b) measuring one or more parameters of each said set of output signals; and
(c) deriving from said measured parameters and the characteristic variables of said combining schemes a derived set of values of characteristic variables for a combining scheme which would yield a set of output signals meeting one or more predetermined criteria if applied to the components of said received signal, whereby said derived set of values represents an estimate of the polarization of the receiving signal, whereby said derived set of values represents an estimate of the polarization of the received signal.

9. A method as claimed in claim 8 wherein two or more of said different combining schemes are applied substantially simultaneously to produce two or more of said sets of output signals substantially simultaneously.

10. The method of claim 9, wherein all of said combining schemes are applied substantially simultaneously to as to provide all of said sets of output signals substantially simultaneously.

11. The method of claim 9 wherein said step of combining said components with one another is performed by providing said components as inputs to a plurality of combining circuits, each said combining circuit including one or more phase shifters, the shifters of different ones of said combining circuits being operative to apply different sets of phase shifts, the characteristics of said different combining schemes including the phase shifts applied by the phase shifters of said different combining circuits.

12. The method of claim 11 wherein each said combining circuit provides a set of two output signals, and wherein said step of measuring one or more parameters of each said set of output signals includes comparing the amplitude of the one output signal in each such set with the amplitude of the other output signal in such set to thereby derive a polarization parameter signal associated for such set.

13. The method of claim 11 wherein each said combining circuit operates on said components as analog signals.

14. The method of claim 13 wherein each said combining circuit includes a first phase shifter applying a preset phase shift $\phi$ to one said component of the input signal to produce a phase-shifted component, a first coupler combining the phase shifted component with the other component of the input signal to produce first and second intermediate signals, a second phase shifter applying a preset phase shift $\gamma$ to the first intermediate signal to produce a phase-shifted first intermediate signal, and a second coupler combining the phase-shifted first intermediate signal with the second intermediate signal to produce a $\Delta$ output signal having amplitude $|\Delta|$ and a $\Sigma$ output signal having amplitude $|\Sigma|$, and wherein said step of comparing the amplitude of the one output signal in each such set with the amplitude of the other output signal in such set includes computing a function of $$\frac{|\Delta|}{|\Sigma|},$$

said deriving step including deriving values of $\gamma$ and $\phi$.

15. The method of claim 14 wherein said estimating step is performed so as to determine values of $\gamma$ and $\phi$ for a combining circuit which would yield a set of output signals having a value of $$\frac{|\Delta|}{|\Sigma|}$$

less than a reference value.

16. The method of claim 14 wherein said estimating step is performed so as to determine values of $\gamma$ and $\phi$ for a combining circuit which would yield a set of output signals having substantially a minimum value of $$\frac{|\Delta|}{|\Sigma|}.$$

17. The method of claim 14 further comprising outputting a set of polarization values for the received signal corresponding to the derived $\gamma$ and $\phi$ values.

18. An apparatus for measuring the polarization of a received signal that has two orthogonal components comprising:
first and second system input terminals;
a plurality of channels, each of said channels including means for combining the received signal components according to a combining scheme having one or more characteristic variables so as to produce a set of one or more output signals, different ones of said combining means applying combining schemes with different values of said one or more characteristic variables, whereby different values of said characteristic variables are associated with different sets of said output signals;
means for measuring at least one parameter of each said set of output signals; and
means for estimating the polarization of the received signal based on said measured parameters of a plurality of said sets of output signals and the values of the characteristic variables of the combining schemes associated with such sets of output signals.

19. Apparatus as claimed in claim 18 wherein said means for estimating includes means for comparing said measured parameters so as to select one said set of output signals which best meets one or more predetermined criteria and thereby select the values of said characteristic variables associated with the selected set of output signals.

20. Apparatus as claimed in claim 18 wherein said means for estimating the polarization includes means for estimating from said measured parameters and the values of the characteristic variables associated with said measured parameters a derived set of characteristic variable values which would yield a set of output signals meeting one or more predetermined criteria if applied to the components of said received signal.

21. Apparatus for measuring the polarization of a received signal that has two orthogonal components comprising:

first and second system input terminals;

a plurality of combining circuits, each of said plurality of combining circuits having a first input connected to the first system input terminal and a second input connected to the second system input terminal whereby when said orthogonal components of the received signal are applied to said first and second system input terminals, said orthogonal components will be applied at the first and second input terminals of each said combining circuit, each said combining circuit having at least one output terminal, each said combining circuit including at least one coupler and at least one phase shifter connected in circuit between said first and second inputs and said at least one output terminal so that each said combining circuit will combine the received signal components according to a combining scheme having one or more characteristic variables so as to produce a set of output signals at said at least one output terminal, different ones of said combining circuits applying combining schemes with different values of said one or more characteristic variables, whereby different values of said characteristic variables are associated with different sets of said output signals;

a plurality of detectors, each such detector being connected to the at least one output terminal of one of said combining circuits, each said detector having a parameter output connection, being operative to produce a parameter signal at such parameter output connection dependent upon the amplitude or amplitudes of the at least one output signal from the combining circuit connected to that detector; and a selector having inputs connected to the parameter output connections of said detectors and a selection output, said selector being operative to compare the parameter signals received by said inputs, select one of said inputs which is receiving the a parameter signal closest to a predetermined value, and provide a selection signal at the selection output.

22. Apparatus as claimed in claim 21 further comprising a memory having stored therein a plurality of different estimates of polarization, said memory being connected to said selection output and operative to retrieve one of said estimates depending upon said selection signal.

23. Apparatus for measuring the polarization of a received signal that has two orthogonal components comprising:

first and second system input terminals;

a plurality of combining circuits, each of said plurality of combining circuits having a first input connected to the first system input terminal and a second input connected to the second system input terminal whereby when said orthogonal components of the received signal are applied to said first and second system input terminals, said orthogonal components will be applied at the first and second input terminals of each said combining circuit, each said combining circuit having at least one output terminal, each said combining circuit including at least one coupler and at least one phase shifter connected in circuit between said first and second inputs and said at least one output terminal so that each said combining circuit will combine the received signal components according to a combining scheme having one or more characteristic variables so as to produce a set of output signals at said at least one output terminal, different ones of said combining circuits applying combining schemes with different values of said one or more characteristic variables, whereby different values of said characteristic variables are associated with different sets of said output signals;

a plurality of detectors, each such detector being connected to the at least one output terminal of one of said combining circuits, each said detector having a parameter output connection, being operative to produce a parameter signal at such parameter output connection having a value dependent upon the amplitude or amplitudes of the at least one output signal from the combining circuit connected to that detector; and a memory having stored therein the values of the characteristic variables for the combining circuit connected to each said detector;

a processor connected to said memory and to said parameter outputs of said detectors, said processor being operative to perform a set of instructions including optimization of the characteristic variables based on said stored values and said values of said parameter signals so as to derive a set of values for said characteristic variables which would yield a value for said parameter signal most closely matched to a reference value.

24. Apparatus as claimed in claim 21 or claim 23 wherein each said combining circuit includes two output terminals, a first phase shifter applying a preset phase shift $\phi$ connected to the first input terminal of such combining circuit, a first coupler having inputs connected to the first phase shifter and to the second input terminal and first and second outputs, a second phase shifter applying a preset phase shift $\gamma$ connected to the first output of such first coupler, and a second coupler having inputs connected to the second phase shifter and to the second output of said first coupler, said second coupler having two outputs connected to the output terminals of the combining circuit, whereby when the orthogonal components of the received signal are applied to the input terminals of the combining circuit, the second coupler will produce a $\Delta$ output signal having amplitude $|\Delta|$ at one output terminal of the combining circuit and a $\Sigma$ output signal having amplitude $|\Sigma|$ at the other output terminal of the combining circuit, and the values of the characteristic variables applied by each said combining circuit are values of $\gamma$ and $\phi$.

\* \* \* \* \*

UNITED STATES PATENT AND TRADEMARK OFFICE
CERTIFICATE OF CORRECTION

PATENT NO. : 6,556,002 B1
DATED : April 29, 2003
INVENTOR(S) : Myron Greenbaum and Eugene R. Schineller It is certified that error appears in the above-identified patent and that said Letters Patent is hereby corrected as shown below:

Column 7,
Line 24, "(21, through $21_N$)" with -- ($21_1$ through $21_N$) --.

Signed and Sealed this

Sixteenth Day of September, 2003

JAMES E. ROGAN
*Director of the United States Patent and Trademark Office*